(12) United States Patent
Jang et al.

(10) Patent No.: US 12,207,530 B2
(45) Date of Patent: Jan. 21, 2025

(54) APPARATUS FOR MANUFACTURING DISPLAY APPARATUS AND METHOD OF MANUFACTURING DISPLAY APPARATUS

(71) Applicant: Samsung Display Co., Ltd., Yongin-si (KR)

(72) Inventors: Choelmin Jang, Yongin-si (KR); Dongkyun Ko, Yongin-si (KR); Inkyo Kim, Yongin-si (KR); Sukwon Jung, Yongin-si (KR); Nam Ha, Yongin-si (KR); Myungsoo Huh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 111 days.

(21) Appl. No.: 14/929,159

(22) Filed: Oct. 30, 2015

(65) Prior Publication Data
US 2016/0226031 A1   Aug. 4, 2016

(30) Foreign Application Priority Data
Jan. 29, 2015   (KR) .................. 10-2015-0014589

(51) Int. Cl.
| | | |
|---|---|---|
| C23C 16/44 | (2006.01) | |
| C23C 16/455 | (2006.01) | |
| C23C 16/54 | (2006.01) | |
| H10K 50/844 | (2023.01) | |
| H10K 71/00 | (2023.01) | |
| H10K 77/10 | (2023.01) | |

(52) U.S. Cl.
CPC ......... *H10K 71/00* (2023.02); *C23C 16/4412* (2013.01); *C23C 16/45551* (2013.01); *C23C 16/45563* (2013.01); *C23C 16/54* (2013.01); *H10K 50/844* (2023.02); *H10K 50/8445* (2023.02); *H10K 77/111* (2023.02)

(58) Field of Classification Search
None
See application file for complete search history.

(56) References Cited

U.S. PATENT DOCUMENTS 4,058,430 A * 11/1977 Suntola ............. C23C 16/45525
427/255.13
4,989,541 A *  2/1991 Mikoshiba ........ C23C 16/45517
118/715

(Continued)

FOREIGN PATENT DOCUMENTS

JP       2007-273750      10/2007
KR    10-2006-0019979 A    3/2006

(Continued)

*Primary Examiner* — Karla A Moore
(74) *Attorney, Agent, or Firm* — Lewis Roca Rothgerber Christie LLP

(57) ABSTRACT

An apparatus and method for manufacturing a display apparatus includes: a chamber; a first nozzle unit at the chamber, the first nozzle unit configured to deposit an organic layer or an inorganic layer on a substrate; a second nozzle unit at the chamber, the second nozzle unit configured to deposit the organic layer or the inorganic layer on a substrate and the second nozzle unit being linearly aligned with the first nozzle unit in a first direction; and an injection nozzle unit between the first nozzle unit and the second nozzle unit, the injection nozzle unit configured to inject a first gas in the chamber toward the substrate.

16 Claims, 4 Drawing Sheets

(56) References Cited

U.S. PATENT DOCUMENTS

| | | | | |
|---|---|---|---|---|
| 5,122,391 | A * | 6/1992 | Mayer | C03C 17/002 427/109 |
| 6,103,304 | A * | 8/2000 | Mizuno | C23C 16/4412 427/248.1 |
| 6,200,389 | B1 * | 3/2001 | Miller | C03C 17/002 118/715 |
| 6,319,553 | B1 * | 11/2001 | McInerney | C23C 16/4412 118/719 |
| 8,106,583 | B2 | 1/2012 | Shin et al. | |
| 9,508,547 | B1 * | 11/2016 | Pasquale | C23C 16/45565 |
| 10,573,851 | B2 * | 2/2020 | Jang | H10K 71/00 |
| 10,981,193 | B2 * | 4/2021 | Lee | B05D 3/142 |
| 2005/0239294 | A1 * | 10/2005 | Rosenblum | H01L 21/67207 438/778 |
| 2006/0042939 | A1 | 3/2006 | Kim | |
| 2008/0261412 | A1 * | 10/2008 | Yoon | C23C 16/45551 438/785 |
| 2009/0078204 | A1 | 3/2009 | Kerr et al. | |
| 2011/0114992 | A1 | 5/2011 | Schmid et al. | |
| 2011/0247560 | A1 | 10/2011 | Yasui et al. | |
| 2012/0167824 | A1 | 7/2012 | Maeng et al. | |
| 2012/0225195 | A1 * | 9/2012 | Yudovsky | C23C 16/45551 427/58 |
| 2012/0312232 | A1 * | 12/2012 | Kim | C23C 16/45551 118/722 |
| 2013/0302999 | A1 | 11/2013 | Won et al. | |
| 2014/0127404 | A1 * | 5/2014 | Yudovsky | C23C 16/45551 427/248.1 |
| 2014/0322527 | A1 | 10/2014 | Cho et al. | |
| 2015/0086716 | A1 * | 3/2015 | Park | C23C 16/45536 427/255.28 |
| 2016/0251759 | A1 * | 9/2016 | Lee | C23C 16/45536 427/569 |

FOREIGN PATENT DOCUMENTS

| | | | |
|---|---|---|---|
| KR | 10-2008-0048358 | A | 6/2008 |
| KR | 10-2010-0102380 | A | 9/2010 |
| KR | 10-2010-0117633 | A | 11/2010 |
| KR | 10-2011-0054833 | A | 5/2011 |
| KR | 10-2011-0084259 | A | 7/2011 |
| KR | 10-2012-0137017 | A | 12/2012 |
| KR | 20130133489 | A * | 12/2013 |
| KR | 1020140130016 | A | 11/2014 |
| KR | 101512140 | B1 * | 4/2015 |

* cited by examiner

APPARATUS FOR MANUFACTURING DISPLAY APPARATUS AND METHOD OF MANUFACTURING DISPLAY APPARATUS

CROSS-REFERENCE TO RELATED APPLICATION

This application claims priority to and the benefit of Korean Patent Application No. 10-2015-0014589, filed on Jan. 29, 2015 in the Korean Intellectual Property Office, the entire contents of which are incorporated herein by reference.

BACKGROUND

1. Field

One or more exemplary embodiments of the present invention relate to a method and apparatus for manufacturing a display apparatus.

2. Description of the Related Art

Mobile electronic devices have become widely used. Mobile electronic devices, such as tablet personal computers (PCs), as well as small electronic devices, such as mobile phones, have come into widespread use in recent times.

The mobile electronic devices often include a display apparatus for providing visual information such as an image or a video. Recently, as components for driving the display apparatus have become miniaturized, the display apparatus has gained an increased significance in the mobile electronic devices. Also, a structure in which the display apparatus is bent or bendable according to a pre-determined angle has been developed.

In particular, when the display apparatus is formed to be bendable or flexible as described above, a display unit of the display apparatus may be encapsulated by using multiple thin films, in consideration of the life span of the display apparatus. As such, one or more encapsulation thin films may be formed, and the encapsulation thin films may be formed by alternately stacking an organic layer and an inorganic layer. The organic layer and the inorganic layer forming the encapsulation thin film may be separately formed by using various methods.

Information disclosed in this Background section is only for enhancement of understanding of the invention and may include technical information acquired in the process of achieving the inventive concept. Therefore, it may contain information that does not form prior art.

SUMMARY

One or more exemplary embodiments include a method and apparatus for manufacturing a display apparatus.

Additional aspects are set forth in part in the description which follows and, in part, will be apparent from the description, or may be learned by practice of the presented example embodiments.

According to one or more exemplary embodiments, an apparatus for manufacturing a display apparatus includes: a chamber; a first nozzle unit at the chamber, the first nozzle unit configured to deposit an organic layer or an inorganic layer on a substrate; a second nozzle unit at the chamber, the second nozzle unit configured to deposit the organic layer or the inorganic layer on a substrate and the second nozzle unit being linearly aligned with the first nozzle unit in a first direction; and an injection nozzle unit between the first nozzle unit and the second nozzle unit, the injection nozzle unit configured to inject a first gas in the chamber toward the substrate.

The first gas may be injected by the injection nozzle unit and may be discharged by the first nozzle unit or the second nozzle unit.

The first nozzle unit may include a first supply nozzle unit that injects a first source gas, and a first discharge nozzle unit between the injection nozzle unit and the first supply nozzle unit, the first discharge nozzle unit discharging at least one selected from the first gas and the first source gas.

The first discharge nozzle unit may discharge a mixture of the first gas and the first source gas.

The first source gas and the first gas may be injected in a second direction toward the substrate and may be discharged in a third direction opposite to the second direction.

The second nozzle unit may include a second supply nozzle unit that injects a second source gas, a second discharge nozzle unit outside the second supply nozzle unit, the second discharge unit discharging the second source gas, and a third discharge nozzle unit between the injection nozzle unit and the second discharge nozzle unit, the third discharge nozzle unit discharging the first gas.

The second nozzle unit may further include a separation nozzle unit between the second discharge nozzle unit and the third discharge nozzle unit, the separation nozzle unit injecting a purge gas.

The second nozzle unit may discharge the first gas and the second source gas separately.

The second source gas and the first gas may be injected in the second direction toward the substrate and may be discharged in the third direction opposite to the second direction.

The injection nozzle unit may inject the first gas stored in the chamber in the second direction toward the substrate to concurrently clean the first nozzle unit and the second nozzle unit.

The first nozzle unit and the second nozzle unit may have the same size.

The apparatus may further include a substrate mounting unit under the first nozzle unit and the second nozzle unit the substrate mounting unit moving in a linear reciprocating motion in the first direction and holding the substrate. The substrate may have a display unit thereon.

The apparatus may further include a loading unit connected to an end of the chamber and that inserts the substrate into the chamber, the substrate having a display unit thereon, and an unloading unit connected to an opposite end of the chamber, the unloading unit removing the substrate from the chamber after at least one selected from the organic layer and the inorganic layer is formed on the substrate.

The apparatus may further include a protection layer-forming device connected to the unloading unit, the protection-layer forming device forming a protection layer on the display unit.

According to one or more exemplary embodiments, an apparatus for manufacturing a display apparatus includes: a chamber configured to be filled with a first gas; an encapsulation layer-forming nozzle unit at the chamber and including a first nozzle unit that deposits an organic layer or an inorganic layer and a second nozzle unit that deposits the organic layer or the inorganic layer, the second nozzle unit being spaced apart from the first nozzle unit; and a substrate mounting unit under the encapsulation layer-forming nozzle unit, that moves in a linear reciprocating motion in a first direction and is holds a substrate having a display unit formed thereon.

The first gas may pass through a gap between the first nozzle unit and the second nozzle unit to flow into the first nozzle unit and the second nozzle unit.

The first nozzle unit may inject a first source gas toward the substrate and may discharge a mixture of the first source gas and the first gas. The second nozzle unit may inject a second source gas toward the substrate and may discharge the second source gas and the first gas separately.

According to one or more exemplary embodiments, a method of manufacturing a display apparatus includes: inserting a substrate into a chamber filled with a reactive gas, the substrate having a display unit formed on a surface thereof; forming an encapsulation layer by depositing an organic layer or an inorganic layer on the display unit via a first nozzle unit inside the chamber and depositing the organic layer or the inorganic layer on the display unit via a second nozzle unit linearly aligned with the first nozzle unit; and forming a protection layer on the encapsulation layer via a protection layer-forming device connected to the chamber.

The forming of the encapsulation layer may include forming the organic layer by mixing a first source gas and the reactive gas in the first nozzle unit and forming the inorganic layer by separating a second source gas and the reactive gas in the second nozzle unit.

The method may further include cleaning the first nozzle unit and the second nozzle unit by injecting a cleaning gas into the chamber.

BRIEF DESCRIPTION OF THE DRAWINGS

These and/or other aspects will become apparent and more readily appreciated from the following description of exemplary embodiments, taken in conjunction with the accompanying drawings in which:

FIG. 5 is a cross-sectional view that illustrates a method of cleaning of a thin film encapsulation manufacturing device according to one or more exemplary embodiments; and FIG. 6 is a cross-sectional view of a substrate that is manufactured by the apparatus for manufacturing a display apparatus of FIG. 1.

DETAILED DESCRIPTION

Figure 1:
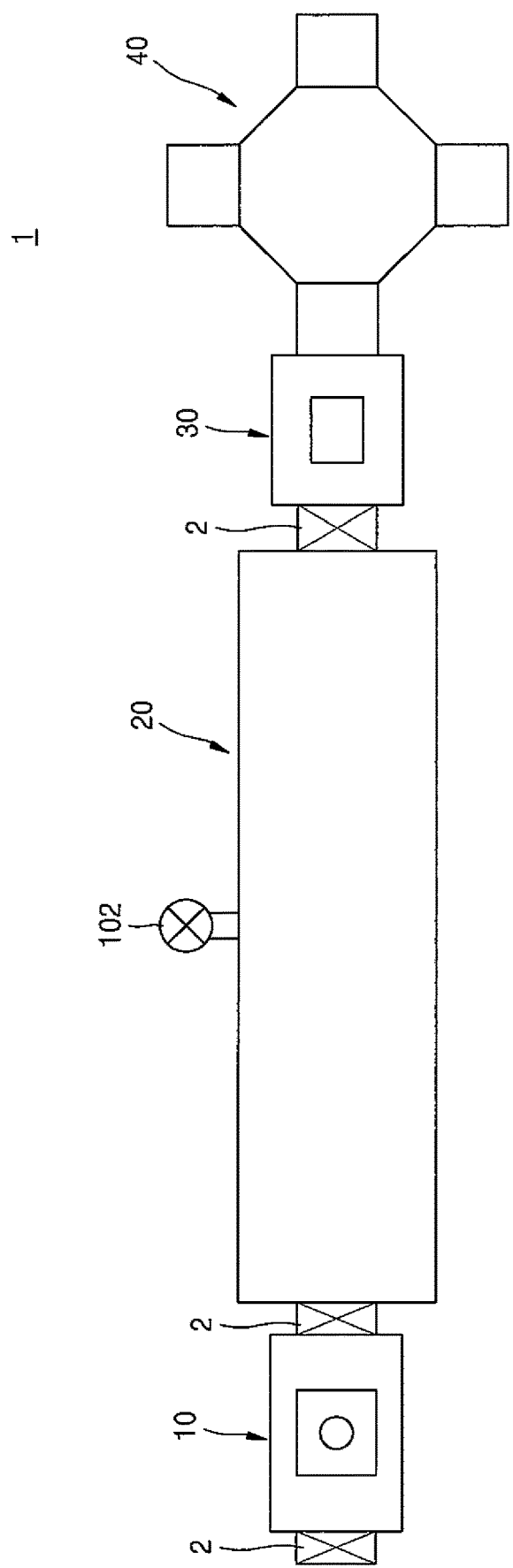
FIG. 1 is a schematic view of an apparatus for manufacturing a display apparatus, according to one or more exemplary embodiments.

Reference is made herein to exemplary embodiments of the present invention, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present invention. It will be understood that although the terms "first," "second," etc. may be used herein to describe various components, these components should not be limited by these terms. These components are only used to distinguish one component from another. As used herein, the singular forms "a," and "an" are intended to include the plural forms as well, unless the context clearly indicates otherwise. It will be further understood that the terms "comprises," "comprising," "includes," and/or "including" used herein specify the presence of stated features or components, but do not preclude the presence or addition of one or more other features or components. The use of "may" when describing embodiments of the present invention refers to "one or more embodiments of the present invention." Also, the term "exemplary" is intended to refer to an example or illustration.

Sizes of elements in the drawings may be exaggerated for convenience of explanation. In other words, because sizes and thicknesses of components in the drawings are arbitrarily illustrated for convenience of explanation, the following embodiments are not limited thereto. When a certain embodiment may be implemented differently, a specific process order may be performed differently from the described order. For example, two consecutively described processes may be performed substantially at the same time or performed in an order opposite to the described order.

It will be understood that when an element or layer is referred to as being "on" another element or layer, it can be directly on the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic view of an apparatus for manufacturing a display apparatus 1, according to one or more embodiments of the present invention.

Referring to FIG. 1, the apparatus for manufacturing a display apparatus 1 may include a loading unit 10, a thin film encapsulation manufacturing device 20, an unloading unit 30, and a protection layer forming device 40.

The loading unit 10 may load a substrate 210 that is supplied from outside the apparatus for manufacturing a display apparatus 1 and may transport the substrate 210 to the thin film encapsulation manufacturing device 20. The loading unit 10 may be the same as or similar to a loading chamber that is generally used for manufacturing a display apparatus, and thus, the loading unit 10 is not described in detail.

The loading unit 10 may be connected to a display device deposition apparatus and may be inserted into the thin film encapsulation manufacturing device 20 after a display unit D is deposited on the substrate 210. The display device deposition apparatus is a device that deposits layers that are formed by being patterned, from among layers interposed between a pixel electrode and an opposite electrode of an organic light-emitting display apparatus instead of being integrally formed throughout the pixels. For example, the display device deposition apparatus may be a device that deposits a red emission layer, a green emission layer, and a blue emission layer.

The thin film encapsulation manufacturing device 20 integrally forms an encapsulation unit E on the entire surface of an organic light-emitting device (OLED) that is patterned.

The unloading unit 30 may transport the substrate 210 that is supplied from the thin film encapsulation manufacturing device 20 to the protection layer forming device 40. The unloading unit 30 may include a robot arm to transport the substrate 210.

The protection layer forming device 40 may form a protection layer P. The protection layer P may be formed according to various methods. For example, the protection layer P may be formed by using a sputtering method, an ion beam deposition method, an evaporation method, or a chemical vapor deposition method.

Figure 2:
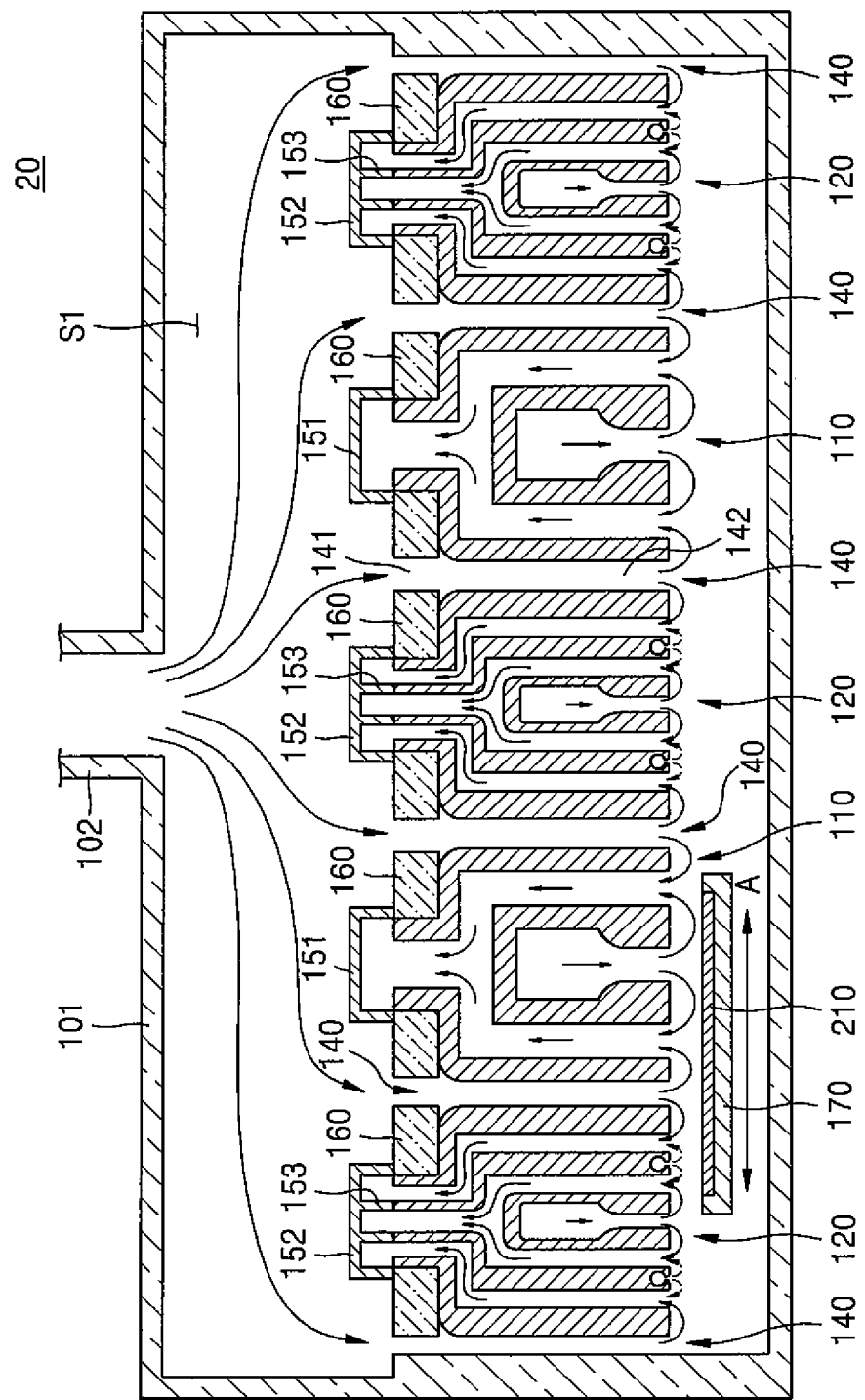
FIG. 2 is a cross-sectional view of a thin film encapsulation manufacturing device of FIG. 1.
Figure 3:
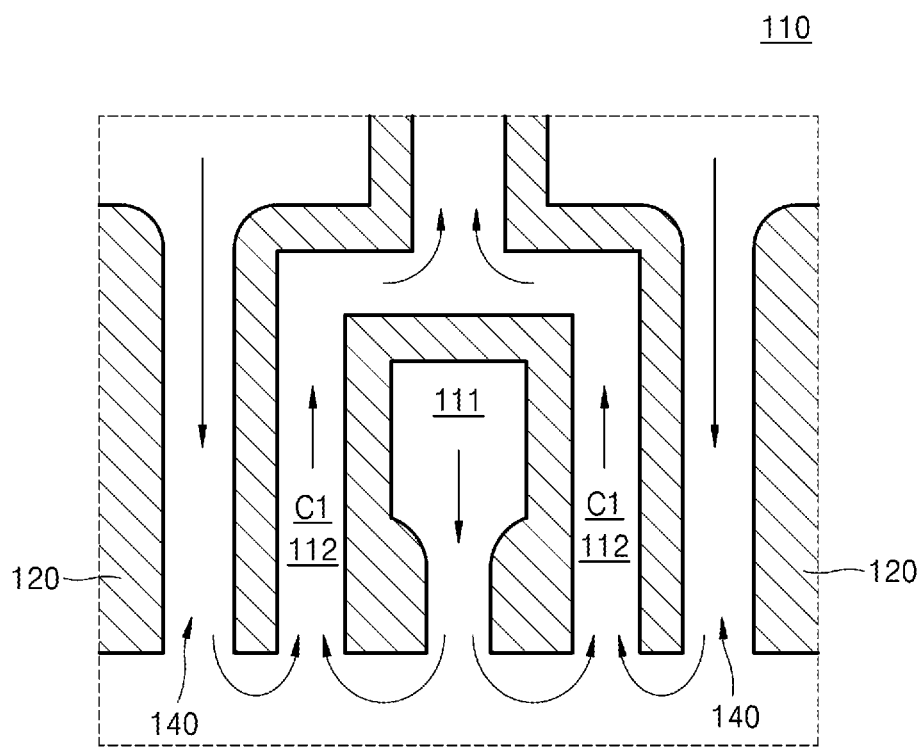
FIG. 3 is a cross-sectional view of a first nozzle unit of FIG. 2.
Figure 4:
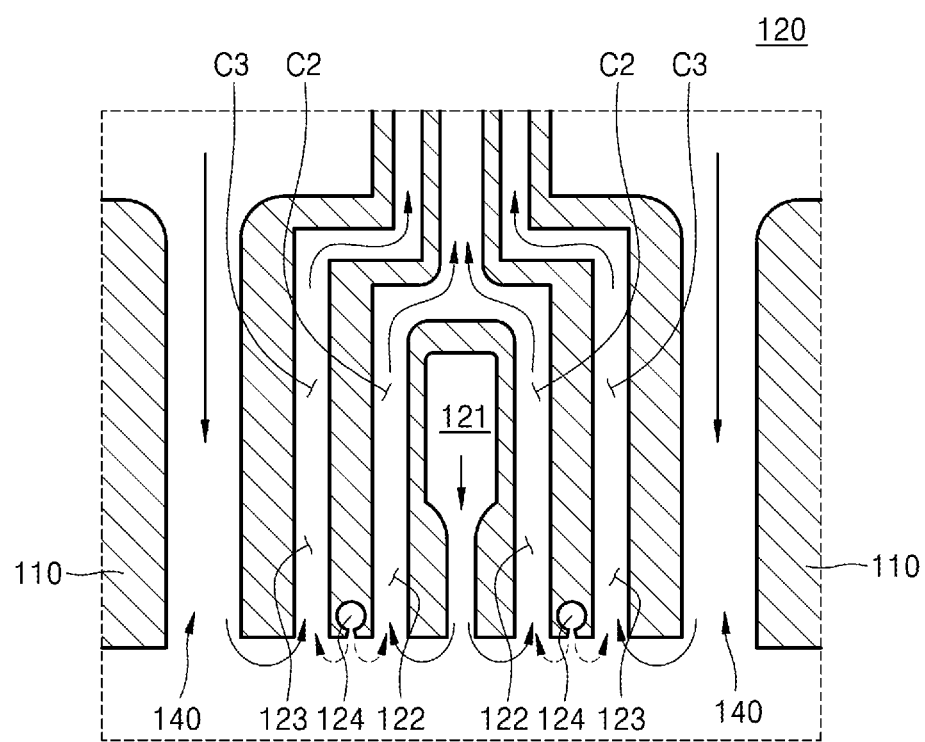
FIG. 4 is a cross-sectional view of a second nozzle unit of FIG. 2.

FIG. 2 is a cross-sectional view of the thin film encapsulation manufacturing device 20 of FIG. 1. FIG. 3 is a cross-sectional view of a first nozzle unit 110 of FIG. 2. FIG. 4 is a cross-sectional view of a second nozzle unit 120 of FIG. 2.

Referring to FIGS. 2 and 3, the thin film encapsulation manufacturing device 20 may include a chamber 101, the first nozzle unit 110, the second nozzle unit 120, an injection nozzle unit 140, and a substrate mounting unit 170.

The chamber 101 may be connected to the loading unit 10 and to the unloading unit 30. A gate valve 2 may be provided between the chamber 101 and the loading unit 10 and between the chamber 101 and the unloading unit 30.

The first nozzle unit 110, the second nozzle unit 120, and the substrate mounting unit 170 may be formed in the chamber 101. The first nozzle unit 110 and the second nozzle unit 120 may be arranged in a linear alignment in a first direction (e.g., may be arranged in parallel or in an in-line shape).

The arrangement of the first nozzle unit 110 and the second nozzle unit 120 may have any suitable arrangement according to an order of an organic layer and an inorganic layer (e.g., according to a desired stacking order of an organic layer and an inorganic layer). For example, according to one or more embodiments, the first nozzle unit 110 and the second nozzle unit 120 may be alternately stacked and the injection nozzle unit 140 may be formed between the first nozzle unit 110 and the second nozzle unit 120. That is, the first nozzle unit 110, the injection nozzle unit 140, and the second nozzle unit 120 may form one group and a plurality of groups may be linearly aligned, or formed in an in-line alignment.

According to one or more embodiments, a plurality of first nozzle units 110 may be sequentially arranged, and the second nozzle unit 120 may be formed adjacent to any one of the plurality of first nozzle units 110. According to another embodiment, a plurality of second nozzle units 120 may be sequentially arranged, and the first nozzle unit 110 may be formed adjacent to any one of the plurality of second nozzle units 120. That is, the number of the first nozzle units 110 may be greater than the number of the second nozzle units 120, or the number of the second nozzle units 120 may be greater than the number of the first nozzle units 110.

The arrangement of the first nozzle unit 110 and the second nozzle unit 120 is not limited to the embodiments described above, and may include any suitable arrangement such that the deposited organic layer and inorganic layer are stacked, regardless of the order of the first nozzle unit 110 and the second nozzle unit 120.

However, for convenience of explanation, the description below is made with reference to one or more embodiments wherein the first nozzle units 110 and the second nozzle units 120 are alternately arranged, and the injection nozzle unit 140 is formed between the first nozzle unit 110 and the second nozzle unit 120.

A gas may be filled in the chamber 101 through an upper portion thereof. An inflow pipe 102 may be connected to the chamber 101 and a charge space S1 of the chamber 101 may be charged with a first gas.

The first gas with which the chamber 101 is charged may vary according to an intended use of the thin film encapsulation manufacturing device 20. If the first gas is a reactive gas, the encapsulation unit E may be formed on the substrate 210 in the thin film encapsulation manufacturing device 20. The reactive gas may pass through the injection nozzle unit 140 and may form an organic layer or an inorganic layer by reacting with a first source gas of the first nozzle unit 110. In addition, the reactive gas may pass through the injection nozzle unit 140 and may form the organic layer or the inorganic layer by reacting with a second source gas of the second nozzle unit 120. Also, the first nozzle unit 110 and the second nozzle unit 120 may form different layers having different characteristic.

For the reactive gas, a reactive gas that reacts with the first source gas and with the second source gas may be used. Also, if a gas injected into the chamber 101 reacts with either one of the first source gas and the second source gas, or if the gas injected into the chamber 101 does not react with the first source gas and the second source gas, the gas injected into the chamber 101 may be converted into a reactive gas of a radical state by using a plasma. A plasma generating device may be formed in the chamber 101 to convert the first gas into the radical state, and the converted first gas may react with the first source gas and the second source gas.

During cleaning of the thin film encapsulation manufacturing device 20, the first gas may be used as a cleaning gas. The cleaning gas is not limited to a particular gas, and may include any suitable gas that can clean the inside portion of the first nozzle unit 110 and the second nozzle unit 120. For example, the cleaning gas may include chlorine ($Cl_2$), nitrogen trifluoride ($NF_3$), boron trichloride ($BCl_3$), or carbon tetrachloride ($CCl_4$).

An encapsulation layer forming nozzle unit 130 may include the first nozzle unit 110 and the second nozzle unit 120. The first nozzle unit 110 and the second nozzle unit 120 may be the same or substantially the same size. The encapsulation layer forming nozzle unit 130 may exchange the first nozzle unit 110 and the second nozzle unit 120 according to a desired shape or order of a stack of the encapsulation unit E on the substrate 210. That is, the order of the first nozzle unit 110 and the second nozzle unit 120 may be changed or the number of either of the first nozzle units 110 and the second nozzle units 120 may be greater than the number of the other, according to an order of the organic layer and the inorganic layer or the number of the organic layers and the inorganic layers, which are deposited on the substrate 210.

The first nozzle unit 110 may be formed in a lower portion of the charge space S1. The first nozzle unit 110 may deposit the organic layer or the inorganic layer by using chemical vapor deposition. The first nozzle unit 110 may include a first supply nozzle unit 111 and a first discharge nozzle unit 112.

The first supply nozzle unit 111 may be formed in the center of the first nozzle unit 110 and may inject the first source gas. The first source gas may be supplied to the first supply nozzle unit 111 separately and may move (or flow) in a second direction (e.g., in a downward direction) along the first supply nozzle unit 111. That is, the first supply nozzle unit 111 may inject the first source gas toward the substrate 210.

The first discharge nozzle unit 112 is formed around an outer portion of the first supply nozzle unit 111. The first discharge nozzle unit 112 may be arranged to surround a portion of the first supply nozzle unit 111. That is, the first discharge nozzle unit 112 may be formed between the injection nozzle unit 140 and the first supply nozzle unit 111. The first discharge nozzle unit 112 may surround the first supply nozzle unit 111 and may converge above an upper portion of the first supply nozzle unit 111.

The first discharge nozzle unit 112 forms a first channel C1 through which the reactive gas or the first source gas is discharged. That is, the first discharge nozzle unit 112 may form the first channel C1 through which the reactive gas and the first source gas are discharged after being reacted with each other.

The first discharge nozzle unit 112 is connected to a first discharge pipe 151 that may discharge the first source gas or the reactive gas to the outside. A supporter 160 is formed outside the first discharge nozzle unit 112 to fix the first nozzle unit 110 to the chamber 101.

The second nozzle unit 120 may be formed at the lower portion of the charge space S1 and may be disposed in line with the first nozzle unit 110 (e.g., may be linearly aligned or in parallel with the first nozzle unit 110). The first nozzle unit 110 and the second nozzle unit 120 may be aligned with each other in a first direction (e.g., a lengthwise direction of the chamber 101). The second nozzle unit 120 may deposit the inorganic layer by an atom layer deposition method. The second nozzle unit 120 may include a second supply nozzle unit 121, a second discharge nozzle unit 122, a third discharge nozzle unit 123, and a separation nozzle unit 124.

The second supply nozzle unit 121 may be formed at the center of the second nozzle unit 120 and may inject the second source gas. The second source gas may be supplied to the second supply nozzle unit 121 separately and may move or flow in the second direction (e.g., may flow downward) along the second supply nozzle unit 121. That is, the second supply nozzle unit 121 may inject the second source gas toward the substrate 210.

The second discharge nozzle unit 122 is formed around an outer portion of the second supply nozzle unit 121. The second discharge nozzle unit 122 may surround a portion of the second supply nozzle unit 121. The second discharge nozzle unit 122 may surround the outer portion of the second supply nozzle unit 121 and may converge above an upper portion of the second supply nozzle unit 121. The second discharge nozzle unit 122 forms a second channel C2 through which the second source gas is discharged.

The third discharge nozzle unit 123 is formed around an outer portion of the second discharge nozzle unit 122. The third discharge nozzle unit 123 may be arranged to surround a portion of the second discharge nozzle unit 122. That is, the third discharge nozzle unit 123 may be formed between the injection nozzle unit 140 and the second discharge nozzle unit 122. The third discharge nozzle unit 123 forms a third channel C3 through which the reactive gas is discharged.

The separation nozzle unit 124 may be formed between the second discharge nozzle unit 122 and the third discharge nozzle unit 123. The separation nozzle unit 124 may inject a purge gas to prevent the reactive gas and the second source gas from being mixed with each other. The separation nozzle unit 124 may inject the purge gas so that the second source gas is discharged through the second discharge nozzle unit 122 and the reactive gas is discharged through the third discharge nozzle unit 123.

The purge gas may include an inert gas. For example, the purge gas may include Ar, He, or $N_2$. The separation nozzle unit 124 may inject the inert gas to prevent or substantially prevent the reactive gas and the second source gas from being mixed with each other, as described above.

The second discharge nozzle unit 122 and the third discharge nozzle unit 123 are connected to a second discharge pipe 152 that may separately discharge the second source gas and the reactive gas to the outside. A separation layer 153 may be formed in the second discharge pipe 152 to prevent or substantially prevent the second source gas and the reactive gas from being mixed with each other in the second discharge pipe 152. The supporter 160 is formed outside the second discharge nozzle unit 122 to fix the second nozzle unit 120 to the chamber 101.

The injection nozzle unit 140 may be formed between an outer portion of the first nozzle unit 110 and an outer portion of the second nozzle unit 120. The injection nozzle unit 140 may inject the first gas charged in the charge space S1 of the chamber 101 toward the lower portion of the charge space S1 (i.e., in the second direction).

The injection nozzle unit 140 may receive or direct the first gas into an inflow end 141 between the supporters 160. The inflow end 141 may be formed as a slot or as a plurality of openings or holes. However, for convenience of explanation, without being limited thereto the following description is made with reference to one or more embodiments wherein the inflow end 141 is formed as a slot between the first nozzle unit 110 and the second nozzle unit 120.

The first gas received into the inflow end 141 may move toward a lower or bottom portion of a side wall of the first nozzle unit 110 or the second nozzle unit 120. After the first gas is injected (e.g., injected toward the substrate 210) by passing through a discharge end 142, the first gas may move to the first discharge nozzle unit 112 of the first nozzle unit 110 or to the third discharge nozzle unit 123 of the second nozzle unit 120.

The substrate mounting unit 170 may include a groove in which the substrate 210 may be mounted, and may transport the substrate 210 into the chamber 101. The substrate mounting unit 170 may include a heating device or a refrigerating device for heating or refrigerating the substrate 210, respectively, and may include a fixing device to fix the substrate 210. The fixing device may be any suitable device, for example, the fixing device may be a clamp, a pressurizing device, an adhesive material, etc.

During deposition, the substrate mounting unit 170 moves in a reciprocating motion a plurality of times along a substantially straight line (e.g., a straight line or a substantially straight line parallel to the first direction) under the first nozzle unit 110 and the second nozzle unit 120. The number of reciprocating movements may determine a thickness of a thin film deposited on the substrate 210.

Hereinafter, a method of manufacturing a display apparatus by using the apparatus for manufacturing a display apparatus 1 is described.

The substrate 210 having the display unit D formed thereon (e.g., the substrate 210 having the display unit D formed on a surface thereof) may be inserted into the chamber 101 via the loading unit 10. The chamber 101 may be filled with a reactive gas.

An encapsulation layer may be formed by the first nozzle unit 110 and the second nozzle unit 120. The first nozzle unit 110 and the second nozzle unit 120 may be sequentially arranged in the first direction. The first nozzle unit 110 may deposit an organic layer or an inorganic layer on the display unit D by using a chemical vapor deposition method. The second nozzle unit 120 may deposit an inorganic layer on the display unit D by using an atomic layer deposition method.

The first nozzle unit 110 may inject a first source gas toward the substrate 210 and the injection nozzle unit 140 may inject the reactive gas inside the chamber 101 toward the substrate 210. The reactive gas and the first source gas may be mixed to form the organic layer or the inorganic layer on the substrate 210. After the reaction is completed, the first source gas and the reactive gas may pass through the first discharge nozzle unit 112 and move to the first discharge pipe 151 to be discharged to the outside. That is, the first source gas and the reactive gas may be injected in the second direction (or the downward direction), and after the reaction may be discharged in a third direction opposite to the second direction (e.g., in an upward direction).

The second nozzle unit 120 may inject a second source gas toward the substrate 210 and the injection nozzle unit 140 may inject the reactive gas inside the chamber 101 toward the substrate 210. The second source gas may be injected in the second direction, and then may flow into the second discharge nozzle unit 122 to move to the second discharge pipe 152. The reactive gas may be injected in the second direction, and then may flow into the third discharge nozzle unit 123 to move to the second discharge pipe 152. The separation nozzle unit 124 may be formed between the second discharge nozzle unit 122 and the third discharge nozzle unit 123 to prevent the reactive gas and the second source gas from being mixed with each other.

The substrate 210 may make a reciprocating movement in the first direction along which the first nozzle unit 110 and the second nozzle unit 120 are arranged. The organic layer and the inorganic layer may be sequentially deposited on the display unit D of the substrate 210, according to the arrangement of the first nozzle unit 110 and the second nozzle unit 120.

The substrate 210 may move to the unloading unit 30 and may be inserted into the protection layer forming device 40. The protection layer forming device 40 may form the protection layer P on the encapsulation unit E.

The protection layer P may include a metal-based oxide or a metal-based nitride, such as SiNx, SiOxNy, TIOx, TINx, TiOxNy, ZrOx, TaNx, TaOx, HfOx, and/or AlOx.

The protection layer P may be formed to completely surround a side surface of the encapsulation unit E. Thus, the protection layer P may protect the encapsulation unit E from moisture or oxygen, thereby increasing the life span of the thin film encapsulation unit E.

FIG. 5 is a cross-sectional view that illustrates a method of cleaning the thin film encapsulation manufacturing device 20 of FIG. 1.

Referring to FIG. 5, a method of cleaning the thin film encapsulation manufacturing device 20 is provided below.

A thin film encapsulation manufacturing device is typically cleaned periodically after a plurality of deposition processes is completed. According to one or more exemplary embodiments of the present invention, after the deposition processes are completed, a cleaning gas is charged in the charge space S1 of the chamber 101. The cleaning gas may be injected into the chamber through the inflow pipe 102.

The cleaning gas may flow into the first nozzle unit 110 and the second nozzle unit 120 through the injection nozzle unit 140. For example, the cleaning gas may move to the inflow end 141 formed between the supporters 160 in the charge space S1 and may be discharged through the discharge end 142 of the injection nozzle unit 140.

Then, the cleaning gas may pass through the first discharge nozzle unit 112 to clean the first nozzle unit 110. The cleaning gas may also pass through the second discharge nozzle unit 122 and the third discharge nozzle unit 123 to clean the second nozzle unit 120.

According to the method and apparatus for manufacturing a display apparatus 1, durability of the display apparatus may be improved by sequentially stacking the inorganic layer and the organic layer.

According to the method and apparatus for manufacturing a display apparatus 1, efficiency of deposition may be improved by applying both the chemical vapor deposition method and the atomic layer deposition method in one chamber.

According to the method and apparatus for manufacturing a display apparatus 1, the same reactive gas may be used in the first nozzle unit 110 and the second nozzle unit 120 so that a space utility of the apparatus for manufacturing the display apparatus 1 may be increased.

According to the method and apparatus for manufacturing a display apparatus 1, the cleaning gas may be injected by the injection nozzle unit 140 so that the cleaning operation may be performed without requiring separation or disassembly of the apparatus for manufacturing a display apparatus 1.

FIG. 6 is a cross-sectional view of the substrate 210 that is manufactured by the apparatus for manufacturing a display apparatus 1 of FIG. 1.

Referring to FIG. 6, a display apparatus 200 may include the substrate 210, the display unit D, the encapsulation unit E, and the protection layer P.

The display unit D may be formed on the substrate 210. The display unit D may include a thin film transistor TFT, a passivation layer 270 may be formed to cover the TFT, and an organic light-emitting device (OLED) may be formed on the passivation layer 270.

The substrate 210 may be formed of a glass material, but the present invention is not limited thereto. The substrate 210 may be formed of a plastic material, or a metal material such as SUS and/or Ti. The substrate 210 may be formed of polyimide (PI). Hereinafter, for ease of description, reference is made to one or more embodiments wherein the substrate 210 is formed of the glass material.

A buffer layer 220 formed of an organic compound and/or an inorganic compound may be formed on the substrate 210. The buffer layer 220 may be formed of SiOx ($x \geq 1$) and/or SiNx ($x \geq 1$).

An active layer 230 (e.g., an active layer 230 that is arranged by a pre-determined pattern) is formed on the buffer layer 220, and the active layer 230 is covered by a gate insulating layer 240. The active layer 230 includes a source region 231, a drain region 233 and a channel region 232 between the source region 231 and the drain region 233.

The active layer 230 may include any suitable material or materials. For example, the active layer 230 may include an inorganic semiconductor material, such as amorphous silicon or crystalline silicon. According to other embodiments, the active layer 230 may include an oxide semiconductor. For example, the oxide semiconductor may include oxide of a material selected from groups 12, 13, and 14 metal elements, such as Zn, In, Ga, Sn, Cd, Ge, and Hf, and a compound thereof. For example, the active layer 230 formed of a semiconductor may include G-I—Z—O [$(In_2O_3)a(Ga_2O_3)b(ZnO)c$] (where a, b, and c are real numbers that respectively satisfy conditions of $a \geq 0$, $b \geq 0$, and $c > 0$). However, for ease of description, reference is made to one or more embodiments wherein the active layer 230 is formed of amorphous silicon.

The active layer 230 may be formed by patterning a polycrystalline silicon layer. For example, an amorphous silicon layer may be formed on the buffer layer 220 and then crystallized, forming a polycrystalline silicon layer that may then be patterned. The source region 231 and the drain region 233 of the active layer 230 may be doped with impurities, according to types of the TFT, such as a driving TFT and a switching TFT.

A gate electrode 250 corresponding to the active layer 230 and an interlayer insulating layer 260 covering the gate electrode 250 are formed on the gate insulating layer 240.

Then, after a contact hole H is formed on the interlayer insulating layer 260 and the gate insulating layer 240, a source electrode 271 and a drain electrode 272 are formed on the interlayer insulating layer 260, to respectively contact the source region 231 and the drain region 233.

A passivation layer 270 is formed on the TFT, and a pixel electrode 281 of the OLED is formed on the passivation layer 270. The pixel electrode 281 contacts the drain electrode 272 of the TFT via a via hole H2 formed on the passivation layer 270. The passivation layer 270 may be formed of an inorganic material and/or an organic material, and may be formed as a single layer or as two or more layers. The passivation layer 270 may be formed as a planarization layer wherein an upper surface of the passivation layer 270 is flat regardless of a curve of a lower layer. However, the passivation layer 270 may also be formed to be bent according to the curve of the lower layer. Also, the passivation layer 270 may be formed as a transparent insulator to have a resonance effect.

After the pixel electrode 281 is formed on the passivation layer 270, a pixel-defining layer 290 layer is formed of an organic layer and/or an inorganic layer to cover the pixel electrode 281 and the passivation layer 270. The pixel-defining layer 290 may have an opening to expose the pixel electrode 281.

Next, an intermediate layer 282 and an opposite electrode 283 are formed on at least the pixel electrode 281.

The pixel electrode 281 may function as an anode, and the opposite electrode 283 may function as a cathode. However, the present invention is not limited thereto and the pixel electrode 281 and the opposite electrode 283 may have opposite polarities.

The pixel electrode 281 and the opposite electrode 283 are insulated from each other by the intermediate layer 282, and light is emitted from an organic emission layer by applying voltages of different polarities to the intermediate layer 282.

The intermediate layer 282 may include the organic emission layer. According to one or more embodiments, the intermediate layer 282 may include the organic emission layer, and may further include at least one selected from a hole injection layer (HIL), a hole transport layer (HTL), an electron transport layer (ETL), and an electron injection layer (EIL).

A unit pixel includes a plurality of sub-pixels that may each emit light of various colors. For example, the plurality of sub-pixels may respectively emit lights of red, green, and blue colors or the plurality of sub-pixels may emit lights of red, green, blue, and white colors, respectively.

The organic emission layer may be formed according to any suitable shape or color. For example, a blue organic emission layer, a green organic emission layer, and a red organic emission layer may be formed in the sub-pixels, respectively, so as to form a unit pixel. Also, in addition to the blue, green, and red organic emission layers, an organic emission layer of another color may be formed in a sub-pixel. In particular, in addition to the blue, green, and red organic emission layers, a white emission layer may be formed in a sub-pixel, by stacking the blue, green, and red organic emission layers to form a unit pixel.

Also, although reference is made to each pixel including an emission material, the present inventive concept is not limited thereto. For example, the organic emission layer may be commonly formed in the entire pixels, regardless of a location of each pixel. For example, the organic emission layer may be formed by vertically stacking or mixing layers that include emission materials emitting, for example, a red light, a green light, and a blue light. The organic emission layer may also be formed by other color combinations which may emit a light of a white color. Also, the organic emission layer may further include a color converting layer or a color filter that converts the white light that is emitted into a pre-determined color.

The intermediate layer 282 is not limited to the exemplary embodiments described above. However, for convenience of description, the following description is made with reference to embodiments wherein the blue organic emission layer, the green organic emission layer, and the red organic emission layer are formed as sub-pixels so as to form a unit pixel.

When the substrate 210 including the display unit D is inserted into the chamber 101 via the loading unit 10, the encapsulation unit E may be formed on the display unit D. The encapsulation unit E may include a plurality of inorganic layers or may include an inorganic layer and an organic layer.

The organic layer of the encapsulation unit E is formed of a polymer, and may be a single layer or stacked layers formed of at least one of polyethylene ether phthalate, polyimide (PI), polycarbonate (PC), epoxy, polyethylene, and/or polyacrylate (PAR). The organic layer may be formed of polyacrylate (PAR), and more particularly may include a polymerized monomer composition including a diacrylate monomer and/or a triacrylate monomer. The monomer composition may further include a monoacrylate monomer. The monomer composition may further include a photoinitiator that is well known to those of ordinary skill in the art, such as thermoplastic polyolefin (TPO), but the present invention is not limited thereto. The monomer composition may include epoxy, PI, polyethylene ether phthalate, PC, polyethylene, and/or PAR.

The inorganic layer of the encapsulation unit E may be a single layer or may be stacked layers including metal oxide or metal nitride. In particular, the inorganic layer may include any one of $SiO_2$, SiNx, $Al_2O_3$, $TiO_2$, ZrOx, and/or ZnO.

An uppermost layer of the encapsulation unit E, which is exposed to the outside, may be formed as the inorganic layer to waterproof the OLED.

The encapsulation unit E may include at least one sandwich structure in which at least one organic layer is inserted between at least two inorganic layers. As another example, the encapsulation unit E may include at least one sandwich structure in which at least one inorganic layer is inserted between at least two organic layers. As yet another example, the encapsulation unit E may include the sandwich structure in which at least one organic layer is inserted between at least two inorganic layers and the sandwich structure in which at least one inorganic layer is inserted between at least two organic layers.

The encapsulation unit E may include a first inorganic layer, a first organic layer, and a second inorganic layer sequentially stacked from the top of the OLED.

According to another embodiment, the encapsulation unit E may include a first inorganic layer, a first organic layer, a second inorganic layer, a second organic layer, and a third inorganic layer sequentially stacked from the top of the OLED.

According to another embodiment, the encapsulation unit E may include a first inorganic layer, a first organic layer, a second inorganic layer, a second organic layer, a third inorganic layer, a third organic layer, and a fourth inorganic layer sequentially stacked from the top of the OLED.

According to another embodiment, the encapsulation unit E may include a first inorganic layer, a first organic layer, a second inorganic layer, and a second organic layer.

According to another embodiment, the encapsulation unit E may include a first organic layer, a first inorganic layer, a second organic layer, a second inorganic layer, and a third organic layer.

According to another embodiment, the encapsulation unit E may include a first organic layer, a second organic layer, a first inorganic layer, a third organic layer, a fourth organic layer, a second inorganic layer, a fifth organic layer, and a sixth organic layer.

According to another embodiment, the encapsulation unit E may include a first inorganic layer U1, a first organic layer O1, a second inorganic layer U2, a second organic layer O2, a third inorganic layer U3, and a third organic layer O3 sequentially stacked from the bottom of the OLED.

A halogenated metal layer, including LiF, may further be included between the OLED and the first inorganic layer. The halogenated metal layer may prevent the OLED from being damaged when forming the first inorganic layer by sputtering.

The first organic layer may have a smaller area than the second inorganic layer, and the second organic layer may have a smaller area than the third inorganic layer.

The encapsulation unit E is not limited to the description above, and may include all structures in which the inorganic layer and the organic layer are stacked in various shapes and arrangements.

As described above, according to one or more exemplary embodiments, a display apparatus 200 manufactured according to the method and apparatus for manufacturing a display apparatus 1 may have an increased life span. Also, the apparatus for manufacturing a display apparatus 1 may be cleaned without the need for disassembly or separation of the apparatus for manufacturing a display apparatus 1.

It should be understood that the exemplary embodiments described herein are provided to enhance understanding and not for purposes of limitation. Descriptions of features or aspects within each exemplary embodiment should be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims, and their equivalents.

What is claimed is:

1. An apparatus for manufacturing a display apparatus, the apparatus comprising:
a chamber;
an inflow pipe directly connected through an outer wall of the chamber;
a first nozzle unit at the chamber and configured to deposit an organic layer on a substrate by using chemical vapor deposition;
a second nozzle unit at the chamber and configured to deposit an inorganic layer on the substrate by using atomic layer deposition; and
an injection nozzle unit for injecting a first gas in the chamber toward the substrate through a first space that is defined by an exterior of the first nozzle unit and an exterior of the second nozzle unit, through a second space outside the first nozzle unit, and through a third space outside the second nozzle unit such that the first gas moves from a first end of the chamber to a second end of the chamber that is opposite the first end and that is adjacent the substrate, the first space, the second space, and the third space being connected to one another through a charge space above the first nozzle unit and the second nozzle unit,
wherein the first nozzle unit comprises:
a first supply nozzle unit for injecting a first source gas to react with the first gas to form the organic layer on the substrate; and
a first discharge nozzle unit for discharging both the first gas and the first source gas, and having a first channel surrounding an outer portion of the first supply nozzle unit and converging above an upper portion of the first supply nozzle unit,
wherein the second nozzle unit comprises a plurality of nozzle units and a plurality of channels that consists of a second channel and a third channel, the second nozzle unit comprising:
a second supply nozzle unit among the plurality of nozzle units, the second supply nozzle unit for injecting a second source gas to remain separated from the first gas while forming the inorganic layer on the substrate;
a second discharge nozzle unit among the plurality of nozzle units, the second discharge nozzle unit comprising the second channel for discharging the second source gas separately from the first gas, the second channel surrounding an outer portion of the second supply nozzle unit;
a third discharge nozzle unit among the plurality of nozzle units, the third discharge nozzle unit being around an outer portion of the second discharge nozzle unit and comprising the third channel for discharging the first gas separately from the second source gas, wherein the third channel surrounds a converging portion of the second channel of the second discharge nozzle unit, and comprises a first side and a second side that is opposite the first side, the first and second sides being configured to concurrently discharge the first gas, the third channel of the plurality of channels being an outermost channel of the plurality of channels in the second nozzle unit; and
a separation nozzle unit among the plurality of nozzle units, the separation nozzle unit being between the second discharge nozzle unit and the third discharge nozzle unit at an end of an outer cover of the second discharge nozzle unit that defines an exterior of the second channel and an interior of the third channel, and configured to inject a purge gas toward the substrate between the first space and the second supply nozzle unit and between the third space and the second supply nozzle unit to keep the first gas separated from the second source gas while using atomic layer deposition, wherein the third discharge nozzle unit and the second discharge nozzle unit are configured to physically separate the first gas and the second source gas, and respectively discharge the first gas and the second source gas concurrently with each other, wherein the second source gas in the second discharge nozzle unit is discharged through the second channel, and the first gas in the third discharge nozzle unit is discharged through the third channel, wherein the inflow pipe is located at the first end of the chamber opposite the substrate with the first nozzle unit and the second nozzle unit interposed therebetween, wherein the first gas is injected through the inflow pipe and passes between the first nozzle unit and the second nozzle unit and moves from the first end of the chamber to the second end of the chamber that is opposite the first end and that is adjacent the substrate, wherein the organic layer is formed by a reaction between the first source gas injected by the first nozzle unit and the first gas passing through the first space, and the inorganic layer is formed by the second source gas supplied by the second nozzle unit, and wherein the first gas is separated from the second source gas while the inorganic layer is formed.

2. The apparatus of claim 1, wherein an upper portion of the chamber is configured to store the first gas above the first nozzle unit and the second nozzle unit.

3. The apparatus of claim 1, wherein the first source gas and the first gas are injected in a second direction toward the substrate and are discharged in a third direction opposite to the second direction.

4. The apparatus of claim 1, wherein the second source gas and the first gas are injected in a second direction toward the substrate and are discharged in a third direction opposite to the second direction.

5. The apparatus of claim 1, wherein the injection nozzle unit is configured to inject the first gas in the chamber in a second direction toward the substrate to concurrently clean the first nozzle unit and the second nozzle unit.

6. The apparatus of claim 1, wherein the first nozzle unit and the second nozzle unit are the same size in a height direction and in a width direction.

7. The apparatus of claim 1, further comprising a substrate mounting unit under the first nozzle unit and the second nozzle unit, the substrate mounting unit being configured to move in a linear reciprocating motion in a first direction and to hold the substrate, the substrate having a display unit thereon.

8. The apparatus of claim 1, further comprising:
a loading unit connected to an end of the chamber and configured to insert the substrate into the chamber, the substrate having a display unit thereon; and
an unloading unit connected to an opposite end of the chamber after at least one selected from the organic layer and the inorganic layer is formed on the substrate.

9. The apparatus of claim 8, further comprising a protection layer-forming device connected to the unloading unit.

10. The apparatus of claim 1, wherein the first discharge nozzle unit is connected to a discharge pipe that is disposed above the first supply nozzle unit.

11. The apparatus of claim 1, wherein an outlet of the second discharge nozzle unit and an outlet of the third discharge nozzle unit are both disposed directly above at least a portion of the second supply nozzle unit.

12. The apparatus of claim 11, wherein outlets of the third discharge nozzle unit are disposed at sides of the outlet of the second discharge nozzle unit.

13. The apparatus of claim 1, wherein the first space is defined by an outer cover of the first nozzle unit and an outer cover of the second nozzle unit.

14. An apparatus for manufacturing a display apparatus, the apparatus comprising:
a chamber configured to be filled with a first gas through an inflow pipe directly connected through an outer wall of the chamber;
an encapsulation layer-forming nozzle unit at the chamber and including a first nozzle unit configured to deposit an organic layer or an inorganic layer by using chemical vapor deposition, and a second nozzle unit configured to deposit the organic layer or the inorganic layer by using atomic layer deposition, the second nozzle unit being spaced apart from the first nozzle unit; and
a substrate mounting unit under the encapsulation layer-forming nozzle unit, configured to move in a linear reciprocating motion in a first direction, and configured to hold a substrate having a display unit formed thereon, wherein the first nozzle unit and the second nozzle unit form a first space between the first nozzle unit and the second nozzle unit, the first nozzle unit being adjacent to a second space outside the first nozzle unit, and the second nozzle unit being adjacent to a third space outside the second nozzle unit, the first, second, and third spaces being configured to allow the first gas to flow toward the substrate, wherein the first space, the second space, and the third space are connected to one another through a charge space above the first nozzle unit and the second nozzle unit, wherein the first nozzle unit comprises:
a first supply nozzle unit configured to inject a first source gas; and
a first discharge nozzle unit configured to discharge both the first gas and the first source gas and having a first channel surrounding an outer portion of the first supply nozzle unit, and converging above an upper portion of the first supply nozzle unit, wherein the second nozzle unit comprises a plurality of nozzle units and a plurality of channels that consists of a second channel and a third channel, the second nozzle unit comprising:
a second supply nozzle unit among the plurality of nozzle units, the second supply nozzle unit configured to inject a second source gas to remain separated from the first gas;
a second discharge nozzle unit among the plurality of nozzle units, the second discharge nozzle unit comprising the second channel configured to discharge the second source gas separately from the first gas, the second channel surrounding an outer portion of the second supply nozzle unit;
a third discharge nozzle unit among the plurality of nozzle units, the third discharge nozzle unit being around an outer portion of the second discharge nozzle unit and comprising the third channel for discharging the first gas separately from the second source gas, wherein the third channel surrounds a converging portion of the second channel of the second discharge nozzle unit, and that comprises a first side and a second side that is opposite the first side, the first and second sides being configured to concurrently discharge the first gas, the third channel of the plurality of channels being an outermost channel of the plurality of channels in the second nozzle unit; and a separation nozzle unit among the plurality of nozzle units, the separation nozzle unit being between the second discharge nozzle unit and the third discharge nozzle unit at an end of an outer cover of the second discharge nozzle unit that defines an exterior of the second channel and an interior of the third channel, and configured to inject a purge gas toward the substrate between the first space and the second supply nozzle unit and between the third space and the second supply nozzle unit to keep the first gas separated from the second source gas while using atomic layer deposition, wherein the third discharge nozzle unit and the second discharge nozzle unit are configured to physically separate the first gas and the second source gas, and respectively discharge the first gas and the second source gas concurrently with each other, wherein the second source gas in the second discharge nozzle unit is discharged through the second channel, and the first gas in the third discharge nozzle unit is discharged through the third channel, wherein the inflow pipe is located at a first end of the chamber opposite the substrate with the first nozzle unit and the second nozzle unit interposed therebetween, wherein the first gas is injected through the inflow pipe and passes between the first nozzle unit and the second nozzle unit and moves from the first end of the chamber to a second end of the chamber that is opposite the first end and that is adjacent the substrate, wherein the organic layer is formed by a reaction between the first source gas injected by the first nozzle unit and the first gas passing through the first space, and the inorganic layer is formed by the second source gas supplied by the second nozzle unit, and wherein the first gas is separated from the second source gas while the inorganic layer is formed.

15. The apparatus of claim 14, wherein the charge space is configured to store the first gas above the first nozzle unit and the second nozzle unit in an upper portion of the chamber.

16. The apparatus of claim 14, wherein the first nozzle unit is configured to inject the first source gas toward the substrate and to discharge a mixture of the first source gas and the first gas, and wherein the second nozzle unit is configured to inject the second source gas toward the substrate and to discharge the second source gas and the first gas separately.

* * * * *